(12) United States Patent
Jia et al.

(10) Patent No.: US 12,438,528 B2
(45) Date of Patent: Oct. 7, 2025

(54) TRANSISTOR DV/DT CONTROL CIRCUIT

(71) Applicant: NAVITAS SEMICONDUCTOR LIMITED, Dublin (IE)

(72) Inventors: Hongwei Jia, Aliso Viejo, CA (US); Santosh Sharma, Austin, TX (US); Daniel M. Kinzer, El Segundo, CA (US); Victor Sinow, Fresno, CA (US); Matthew Anthony Topp, Colorado Springs, CO (US)

(73) Assignee: Navitas Semiconductor Limited, Dublin (IE)

( * ) Notice: Subject to any disclaimer, the term of this patent is extended or adjusted under 35 U.S.C. 154(b) by 0 days.

(21) Appl. No.: 18/513,456

(22) Filed: Nov. 17, 2023

(65) Prior Publication Data

US 2024/0235531 A1    Jul. 11, 2024

Related U.S. Application Data

(63) Continuation of application No. 17/853,740, filed on Jun. 29, 2022, now Pat. No. 11,855,635.

(60) Provisional application No. 63/202,940, filed on Jun. 30, 2021.

(30) Foreign Application Priority Data

Jun. 30, 2021    (CN) .......................... 202110732707.1

(51) Int. Cl.
    *H03K 3/012*    (2006.01)
(52) U.S. Cl.
    CPC ................................... *H03K 3/012* (2013.01)

(58) Field of Classification Search
    None
    See application file for complete search history.

(56) References Cited

U.S. PATENT DOCUMENTS

| 4,504,779 A | 3/1985 | Haman |
| 6,271,708 B1 | 8/2001 | Hoshi et al. |
| 7,411,409 B2 | 8/2008 | Klass et al. |

(Continued)

FOREIGN PATENT DOCUMENTS

| CN | 205232018 U | 5/2016 |
| CN | 110855134 A | 2/2020 |

(Continued)

OTHER PUBLICATIONS

Office Action Search Report from related application, TW 112142365, issued Oct. 4, 2024, 6 pages.

(Continued)

*Primary Examiner* — Jeffrey S Zweizig
(74) *Attorney, Agent, or Firm* — FisherBroyles, LLP

(57) ABSTRACT

Circuits and methods that control a rate of change of a drain voltage as a function of time in a transistor are disclosed. In one aspect, the circuit includes a transistor having a gate terminal that controls operation of the transistor, and a control circuit coupled to the gate terminal and arranged to change a voltage at the gate terminal at a first rate of voltage with respect to time from a first voltage to a first intermediate voltage, and further arranged to change the voltage at the gate terminal at a second rate of voltage with respect to time from the first intermediate voltage to a second intermediate voltage, where the first rate is different than the second rate.

18 Claims, 10 Drawing Sheets

(56) References Cited

U.S. PATENT DOCUMENTS

| | | |
|---|---|---|
| 9,024,558 B2 | 5/2015 | Sugie |
| 9,300,285 B2 | 3/2016 | Pang |
| 9,316,681 B2 | 4/2016 | Sicard |
| 9,368,958 B2 | 6/2016 | Ferrara et al. |
| 9,543,928 B2 | 1/2017 | Yamashiro et al. |
| 9,543,942 B2 | 1/2017 | Sicard et al. |
| 9,584,046 B2 | 2/2017 | Sicard |
| 9,588,170 B2 | 3/2017 | Sicard |
| 9,601,985 B2 | 3/2017 | Kandah et al. |
| 9,608,623 B1 | 3/2017 | Kandah et al. |
| 9,720,030 B2 | 8/2017 | Sicard |
| 9,812,941 B2 | 11/2017 | Sicard et al. |
| 10,236,877 B1 | 3/2019 | Sharma et al. |
| 10,355,475 B2 * | 7/2019 | Kinzer ................ H01L 27/0285 |
| 10,516,392 B2 | 12/2019 | Sicard |
| 10,756,728 B2 | 8/2020 | Mori et al. |
| 10,848,145 B2 | 11/2020 | Ishii et al. |
| 10,979,032 B1 | 4/2021 | Leong et al. |
| 11,073,857 B1 | 7/2021 | Liberti et al. |
| 11,211,927 B2 | 12/2021 | Sugie |
| 11,424,741 B2 | 8/2022 | Liberti et al. |
| 11,569,726 B2 | 1/2023 | Keskar |
| 11,831,302 B2 * | 11/2023 | Nakamura ............... H02M 1/44 |
| 11,855,635 B2 | 12/2023 | Jia |
| 11,923,832 B1 | 3/2024 | Xu |
| 12,126,251 B2 | 10/2024 | Zhou |
| 2010/0213990 A1 | 8/2010 | Yang et al. |
| 2016/0099647 A1 | 4/2016 | Zhang et al. |
| 2017/0346475 A1 | 11/2017 | De Rooij et al. |
| 2018/0026629 A1 | 1/2018 | Ptacek |
| 2020/0020417 A1 | 1/2020 | Schnall-Levin et al. |
| 2020/0195246 A1 | 6/2020 | Randolph et al. |
| 2020/0204174 A1 | 6/2020 | Mori |
| 2023/0006538 A1 | 1/2023 | Zhou et al. |
| 2023/0006657 A1 | 1/2023 | Jia |
| 2025/0030331 A1 | 1/2025 | Zhou |

FOREIGN PATENT DOCUMENTS

| | | |
|---|---|---|
| CN | 111106822 A | 5/2020 |
| CN | 111555595 A | 8/2020 |
| CN | 111865054 A | 10/2020 |
| JP | 3997905 B2 | 10/2007 |
| JP | 4532195 B2 | 8/2010 |
| TW | I508096 B | 11/2015 |
| TW | 201607244 A | 2/2016 |
| TW | 201622332 A | 6/2016 |
| TW | 201813305 A | 4/2018 |
| TW | 201937858 A | 9/2019 |
| TW | 202038558 A | 10/2020 |

OTHER PUBLICATIONS

U.S. Appl. No. 17/853,740 , "Ex Parte Quayle Action", Jul. 28, 2023, 4 pages.

U.S. Appl. No. 17/853,740 , Non-Final Office Action, Mailed On Apr. 17, 2023, 10 pages.

U.S. Appl. No. 17/853,740 , Notice of Allowance, Mailed On Aug. 17, 2023, 6 pages.

Application No. TW111124268 , Notice of Decision to Grant, Mailed On Aug. 1, 2023, 4 pages.

Application No. TW111124268 , Office Action, Mailed On Apr. 21, 2023, 7 pages.

Office Action, TW Appl. No. 112142365 received Oct. 4, 2024, 5 pages.

* cited by examiner

TRANSISTOR DV/DT CONTROL CIRCUIT

CROSS-REFERENCE TO RELATED APPLICATIONS

This application is a continuation of U.S. patent application Ser. No. 17/853,740, for "TRANSISTOR TURN-OFF DV/DT CONTROL" filed on Jun. 29, 2022, which claims the benefit of U.S. Provisional Application No. 63/202,940 filed on Jun. 30, 2021, entitled "TRANSISTOR TURN-OFF DV/DT CONTROL", and to China Patent Application No. 202110732707.1 filed on Jun. 30, 2021, entitled "TRANSISTOR TURN-OFF CIRCUIT," the entire contents of which are incorporated herein by reference for all purposes.

FIELD

The described embodiments relate generally to power converter circuits, and more particularly, the present embodiments relate to turn-off circuits for gallium nitride (GaN) transistors employed in power converter circuits.

BACKGROUND

Electronic devices such as computers, servers and televisions, among others, employ one or more electrical power conversion circuits to convert one form of electrical energy to another. Some electrical power conversion circuits convert a high DC voltage to a lower DC voltage using a circuit topology called a half bridge converter. As many electronic devices are sensitive to size and efficiency of the power conversion circuit, new power converters can provide relatively higher efficiency and lower size for the new electronic devices.

SUMMARY

In some embodiments, a circuit is disclosed. The circuit includes a first transistor having a first gate terminal, a first source terminal and a first drain terminal, a second transistor having a second gate terminal, a second source terminal and a second drain terminal, the second drain terminal coupled to the first gate terminal, a control circuit coupled to the second gate terminal and arranged to change a conductive state of the second transistor in response to receiving an input signal, and an impedance element coupled in series to the second transistor, where the impedance element is arranged to control a rate of change of a voltage at the first gate terminal with respect to time.

In some embodiments, the first transistor includes gallium nitride (GaN).

In some embodiments, the second transistor includes silicon.

In some embodiments, the second transistor is disposed in a silicon-based substrate, and the impedance element is disposed adjacent to the silicon-based substrate.

In some embodiments, the circuit further includes a detection circuit coupled to the first gate terminal, and a third transistor having a third gate terminal, a third source terminal and a third drain terminal, where the detection circuit is coupled to the third gate terminal and the third drain terminal is coupled to the first gate terminal.

In some embodiments, the detection circuit is arranged to sense the voltage at the first gate terminal, and in response to the sensed voltage at the first gate terminal reaching a value below a threshold voltage, change a state of the third transistor to a conductive state.

In some embodiments, the circuit further includes a sensing circuit coupled to the impedance element and arranged to sense an impedance value of the impedance element, and a current sink coupled to the second source terminal and to the sensing circuit.

In some embodiments, the sensing circuit is arranged to set a value for a discharge current flowing through the current sink corresponding to a sensed impedance value of the impedance element.

In some embodiments, a circuit is disclosed. The circuit includes a transistor including a gate terminal that controls operation of the transistor, and a control circuit coupled to the gate terminal and arranged to change a voltage at the gate terminal at a first rate of voltage with respect to time from a first voltage to a first intermediate voltage, and arranged to change the voltage at the gate terminal at a second rate of voltage with respect to time from the first intermediate voltage to a second intermediate voltage.

In some embodiments, the first rate is different than the second rate.

In some embodiments, the control circuit is further arranged to change the voltage at the gate terminal at a third rate of voltage with respect to time from the second intermediate voltage to a second voltage.

In some embodiments, the first voltage is an on-state voltage of the transistor that enables current to flow through the transistor and the second voltage is an off-state voltage of the transistor that prevents current from flowing through the transistor.

In some embodiments, the first rate is greater than the second rate.

In some embodiments, the circuit further includes a sense circuit coupled to a drain terminal of the transistor and arranged to sense a voltage at the drain terminal of the transistor, a current mirror circuit coupled to the sense circuit, and a logic and control circuit coupled to the current mirror circuit.

In some embodiments, the circuit further includes a first pull-down transistor having a first gate terminal, a first drain terminal and a first source terminal, and a second pull-down transistor having a second gate terminal, a second drain terminal and a second source terminal, where the first and second drain terminals are coupled to the gate terminal, where the logic and control circuit is coupled to the first and second gate terminals, and arranged to control a conductivity state of the first and second pull-down transistors.

In some embodiments, a circuit is disclosed. The circuit includes a transistor having a gate terminal that controls operation of the transistor, and a control circuit coupled to the gate terminal and arranged to allow a discharge current to flow from the gate terminal at a first current rate during a first time period, and to allow the discharge current to flow from the gate terminal at a second current rate during a second time period, and to allow the discharge current to flow from the gate terminal at the first current rate during a third time period.

In some embodiments, the first current rate is greater than the second current rate.

In some embodiments, the circuit further includes a sense circuit coupled to a drain terminal of the transistor and arranged to sense a voltage at the drain terminal of the transistor, a current mirror circuit coupled to the sense circuit, and a logic and control circuit coupled to the current mirror circuit.

In some embodiments, the circuit further includes a first pull-down transistor having a first gate terminal, a first drain terminal and a first source terminal, and a second pull-down transistor having a second gate terminal, a second drain terminal and a second source terminal, where the first and second drain terminals are coupled to the gate terminal, where the logic and control circuit is coupled to the first and second gate terminals, and arranged to control a conductivity state of the first and second pull-down transistors.

In some embodiments, the first pull-down transistor and the second pull-down transistor are arranged, in combination, to allow the discharge current to flow at the first current rate.

DETAILED DESCRIPTION

Figure 1:
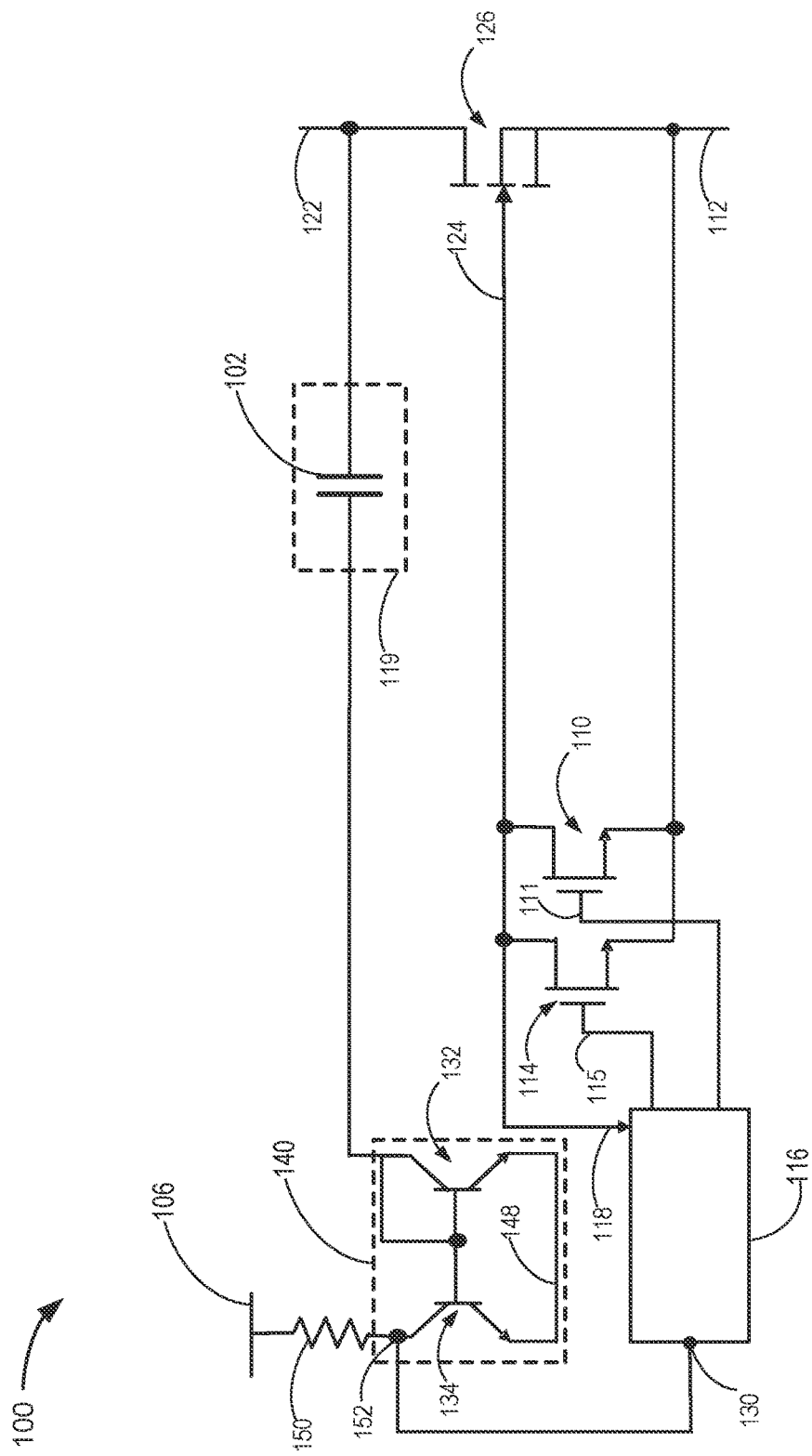
FIG. 1 illustrates a dV/dt control circuit according to an embodiment of the disclosure.

Circuits and related techniques disclosed herein relate generally to power conversion devices. More specifically, circuits, devices and related techniques disclosed herein relate to power transistor dV/dt (a relatively fast rate of change of voltage with respect to time) control circuits. In some embodiments, dV/dt control circuits can be utilized to control and optimize a rate of turning off of a power transistor resulting in reduced voltage oscillations in the power conversion circuit. In various embodiments, a turn-off dV/dt control circuit and related technique can reduce excessive ringing that may occur when an external gate driver integrated circuit (IC) is used to drive a gallium nitride (GaN) power switch. This can be beneficial for power converter circuits employing GaN switches because GaN switches may be relatively more sensitive to excessive oscillations and ringing. In some embodiments, improved electromagnetic interference (EMI) performance can result from the reduced oscillations and ringing in the power conversion circuit. In this way, relatively high operating frequencies can be achieved for power converter circuits that utilize GaN switches.

Embodiments of the disclosure can be employed to control a dV/dt in GaN power switches. A dV/dt event may turn the GaN power transistor back on after the GaN power transistor has been turned off and it is to stay off. This can be due to a coupling of a drain terminal voltage onto the gate terminal through a parasitic miller capacitance that can be present in the GaN power transistor. In some embodiments, a gate voltage of the GaN power transistor can be controlled during turn-off in such a way that can prevent a dV/dt event at the drain terminal of GaN power transistor. In this way, the GaN power transistor can operate in its safe operating area.

Embodiments of the disclosure can also be employed to control a rate of change of drain current as a function of time (dI/dt) in a GaN power switch. Embodiments of the disclosed circuits and techniques can control a slew rate of the drain current in a GaN power switch. By controlling and reducing the dI/dt, a voltage spike on the various terminals of the GaN power switch can be reduced. In this way, the GaN power switch can operate in its safe operating area (SOA). Various inventive embodiments are described herein, including methods, processes, systems, devices, and the like.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates a turn-off control circuit 100 according to an embodiment of the disclosure. As shown in FIG. 1, circuit 100 can include a GaN power transistor 126, with a drain terminal 122, a gate terminal 124 and a source terminal 112. GaN power transistor 126 can be used in a low-side configuration, where source terminal 112 may be connected to a ground node, or in a high-side configuration where source terminal 112 may be connected to a switch node (Vsw). A voltage at the drain terminal 122 drain can rise relatively fast when the GaN power transistor 126 is turned off. A relatively fast rate of change of the drain voltage as a function of time (dV/dt) can turn the GaN power transistor back on due to a coupling of the drain voltage onto the gate terminal 124 through a parasitic miller capacitance of the GaN power transistor 126. This secondary turn on is typically not desirable because an uncontrolled turn-on of the GaN power transistor 126 can cause oscillations and ringing within the power conversion circuit and may damage the GaN power transistor. Furthermore, excessive oscillations and ringing may increase electromagnetic interference (EMI) generation of the power conversion circuit. In some embodiments, a turn-off dV/dt control circuit can reduce the high dV/dt rate by sensing a voltage at the drain terminal 122 and adjusting the gate drive at a gate terminal 124 based on the sensed drain voltage. Moreover, the turn-off dV/dt control circuit can improve EMI performance, as described in greater detail below.

In various embodiments, circuit 100 can also be employed to control a rate of change of drain current as a function of time (dI/dt) in the GaN power transistor 126. When controlling the dI/dt, circuit 100 can control the drain current slew rate when the GaN power transistor 126 is turned off. By controlling and lowering the dI/dt, a voltage spike across the GaN power transistor can be reduced during turn-off. In this way, the GaN power transistor can operate in its safe operating area.

Circuit 100 can include a sensing circuit 119 that is arranged to sense a voltage at the drain terminal 122. In some embodiments, sensing circuit 119 may include a sensing capacitor 102, having a capacitance with a value of C. Circuit 100 can include a $V_{dd}$ terminal 106. The sensing circuit 119 can be connected to the drain terminal 122. The sensing circuit 119 can be connected to a current mirror circuit 140. The current mirror circuit 140 may be connected to a logic circuit 116. The current mirror circuit 140 can include transistors 132 and 134. A node 148 in the current mirror circuit 140 can be connected to a ground node when the GaN power transistor 126 is used in a low-side configuration, or connected to a switch node (Vsw), or other suitable nodes, when the GaN power transistor 126 is used in a high-side configuration. The logic circuit 116 can also be connected to a first pull-down transistor 114 and a second pull-down transistor 110. The first pull-down transistor 114 and the second pull-down transistor 110 can be connected to the gate terminal 124 and to the source terminal 112.

During a dV/dt event, a current I=C×dV/dt can develop through the capacitor 102. This current can be fed into the current mirror circuit 140. Current I can be mirrored from transistor 132 into transistor 134, and can flow through resistor 150 from $V_{dd}$ terminal 106, causing a voltage at node 152 to go to a low state. The voltage at node 152 can be fed into a logic circuit 116 at node 130. The logic circuit 116 can use the signal from node 152 to drive the gate 115 of a first pull-down transistor 114 and gate 111 of a second pull-down transistor 110. The first pull-down transistor 114 and the second pull-down transistor 110 can be used to turn off the GaN power transistor 126. When transistors 114 and 110 are turned on, the gate terminal 124 of the GaN power transistor 126 can go to a low state, thus putting the GaN power transistor 126 in a non-conductive state. In some embodiments, a size of transistor 110 can be, for example, 5 to 10 times larger than transistor 114, thus transistor 110 can pull down the gate terminal 124 at a relatively faster rate than transistor 114 can. As appreciated by one of ordinary skill in the art having the benefit of this disclosure, the value for the ratio of transistor sizes can be set to any suitable value as appropriate for specific applications.

In an initial state, both transistors 114 and 110 may be turned on in order to turn off the GaN power transistor 126 after a pulse width modulated (PWM) signal received by the power converter circuit goes low. When the GaN power transistor 126 is turned off, a voltage at drain terminal 122 can start to rise. A rise in the voltage at drain terminal 122 can indicate that a voltage at the gate terminal 124 has reached a miller plateau. This is illustrated further in a timing diagram 200 in FIG. 2.

Figure 2:
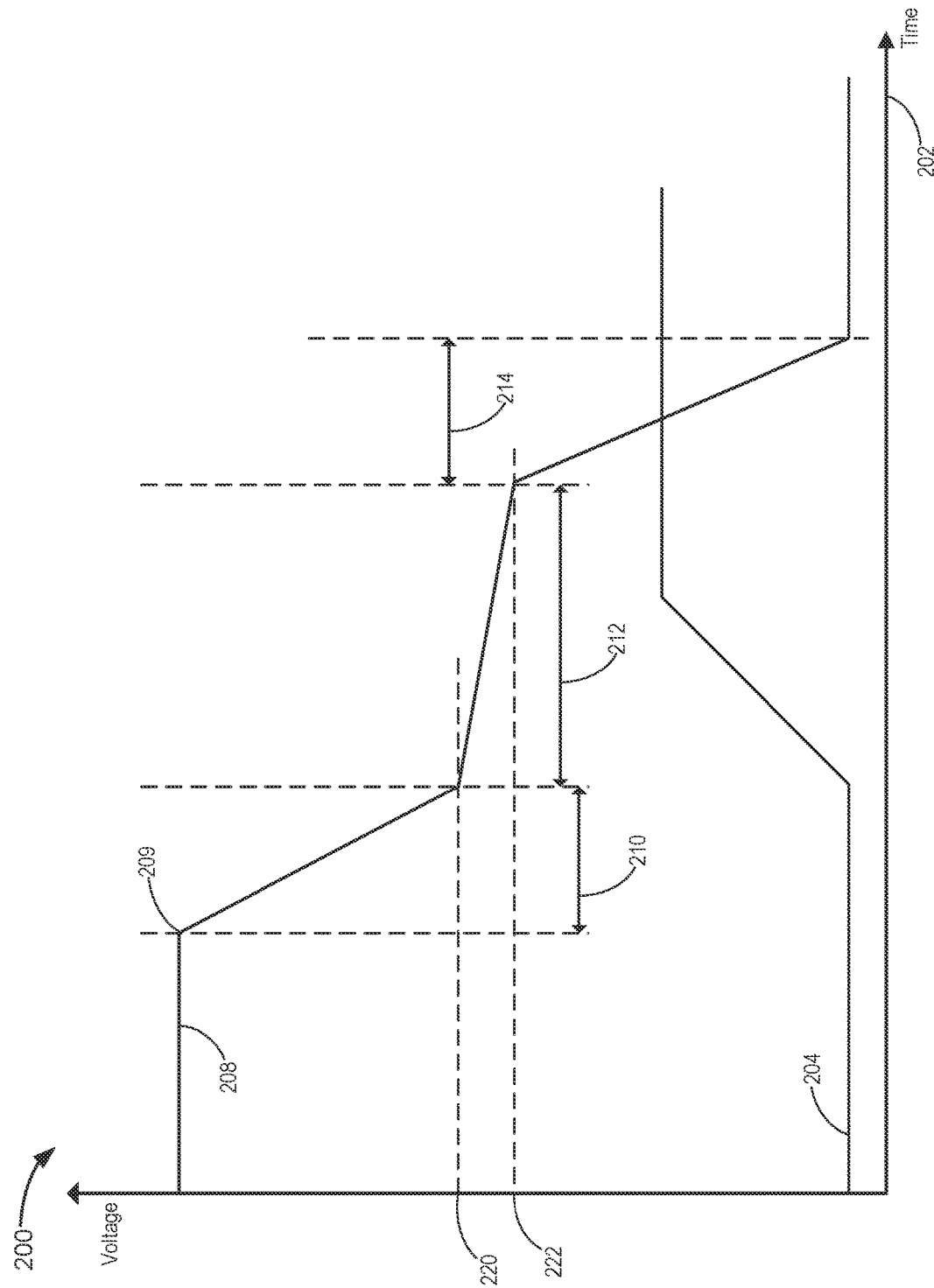
FIG. 2 illustrates a timing diagram showing gate and drain voltages as a function of time for power transistor in the turn-off control circuit of FIG. 1.

Timing diagram 200 in FIG. 2 shows the gate and drain voltages of the GaN power transistor 126 as a function of time 202. Graph 208 shows the voltage at the gate of the GaN power transistor 126 and graph 204 shows the voltage at the drain of the GaN power transistor 126. Initially the gate voltage may start at a high state, i.e., the GaN power transistor 126 is in an on state. When both transistors 110 and 114 are turned on, a voltage at the gate terminal 124 may drop at a relatively fast rate as shown in region 210. During a time period in region 210, the gate voltage drops rapidly from an on-state voltage 209 to a first intermediate voltage 220. This rapid drop can minimize a delay time in turning off the GaN power transistor 126. During a time period in region 212, the gate voltage may drop from the first intermediate voltage 220 to a second intermediate voltage 222 at a relatively slower rate. This slow down can result in a significant reduction in EMI by keeping the gate voltage between the first and the second intermediate voltages. The slow-down of the rate of drop of the gate voltage in region 212 can slow down a rate of discharge of a gate capacitance, reducing ripple in the drain-to-source current in the GaN power transistor 126. In region 212, the gate voltage has reached a miller plateau.

In region 212, the sensing circuit 119 can detect a dV/dt event on the drain terminal 122, and generate a signal at node 130 causing the logic circuit 116 to turn off transistor 110 while keeping transistor 114 in an on state. When the dV/dt event ends, the gate voltage of the GaN power transistor 126 can be allowed to drop again at a relatively rapid rate as indicated in region 214. Following region 214, the logic circuit 116 can detect that the gate voltage has dropped below a threshold voltage, causing transistor 110 to turn on again. Further, logic circuit 116 can sense the gate voltage of the GaN power transistor 126 at node 118. When the logic circuit 116 detects that the gate voltage of the GaN power transistor 126 has dropped below a threshold voltage, the logic circuit can turn on transistor 110. By having both transistors 114 and 110 in an on state and simultaneously providing a pull down to the gate of the GaN power transistor, circuit 100 can maintain GaN power transistor 126 in an off state such that it will not turn back on even if there is a dV/dt event at the drain terminal 122. Thus, a dV/dt immunity of the circuit can be improved by having both transistors 114 and 110 in an on state when the GaN power transistor 126 is off.

Figure 3:
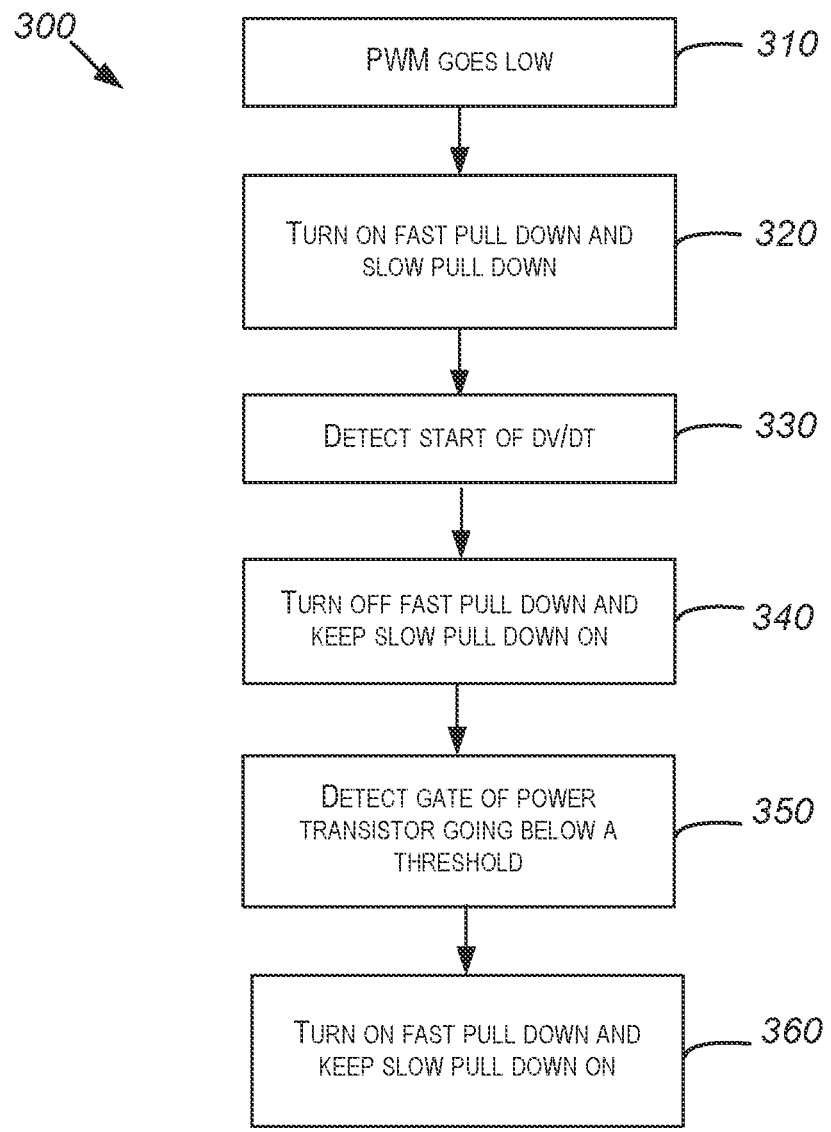
FIG. 3 illustrates steps associated with a method of operating the transistor turn-off control circuit shown in FIG. 1.

FIG. 3 illustrates steps associated with a method 300 for operating turn-off control circuit 100 shown in FIG. 1, according to an embodiment of the disclosure. In step 310 a pulse width modulated (PWM) input signal goes low indicating that the GaN power transistor 126 can be turned off. In step 320 fast pull-down and slow pull-down transistors can be turned on. As shown in circuit 100, the GaN power transistor 126 can be turned off by turning on transistors 110 (fast pull-down transistor) and 114 (slow pull-down transistor). In step 330 the circuit can detect the start of a dV/dt transition. As shown in circuit 100, when a voltage at the drain terminal 122 of the GaN power transistor starts to rise, the sensing capacitor 102 detects a start of the dV/dt transition. In step 340 the circuit can detect a gate of the power transistor transitioning to a voltage below a threshold voltage. As shown in circuit 100, the fast pull-down transistor 110 can be turned off while keeping the slow pull-down transistor 114 on. In step 350, When the dV/dt event has completed and the gate voltage of the GaN power transistor has dropped below a threshold voltage, the logic circuit 116 can detect the low state of the gate voltage. In step 360, the circuit can turn on the fast pull-down transistor and keep the slow pull-down transistor on. As shown in circuit 100, the logic circuit 116 turns on the fast pull-down transistor 110 while keeping the slow pull-down transistor 114 on. It will be appreciated that method 300 is illustrative and that variations and modifications are possible. Steps described as sequential may be executed in parallel, order of steps may be varied, and steps may be modified, combined, added or omitted.

Figure 4:
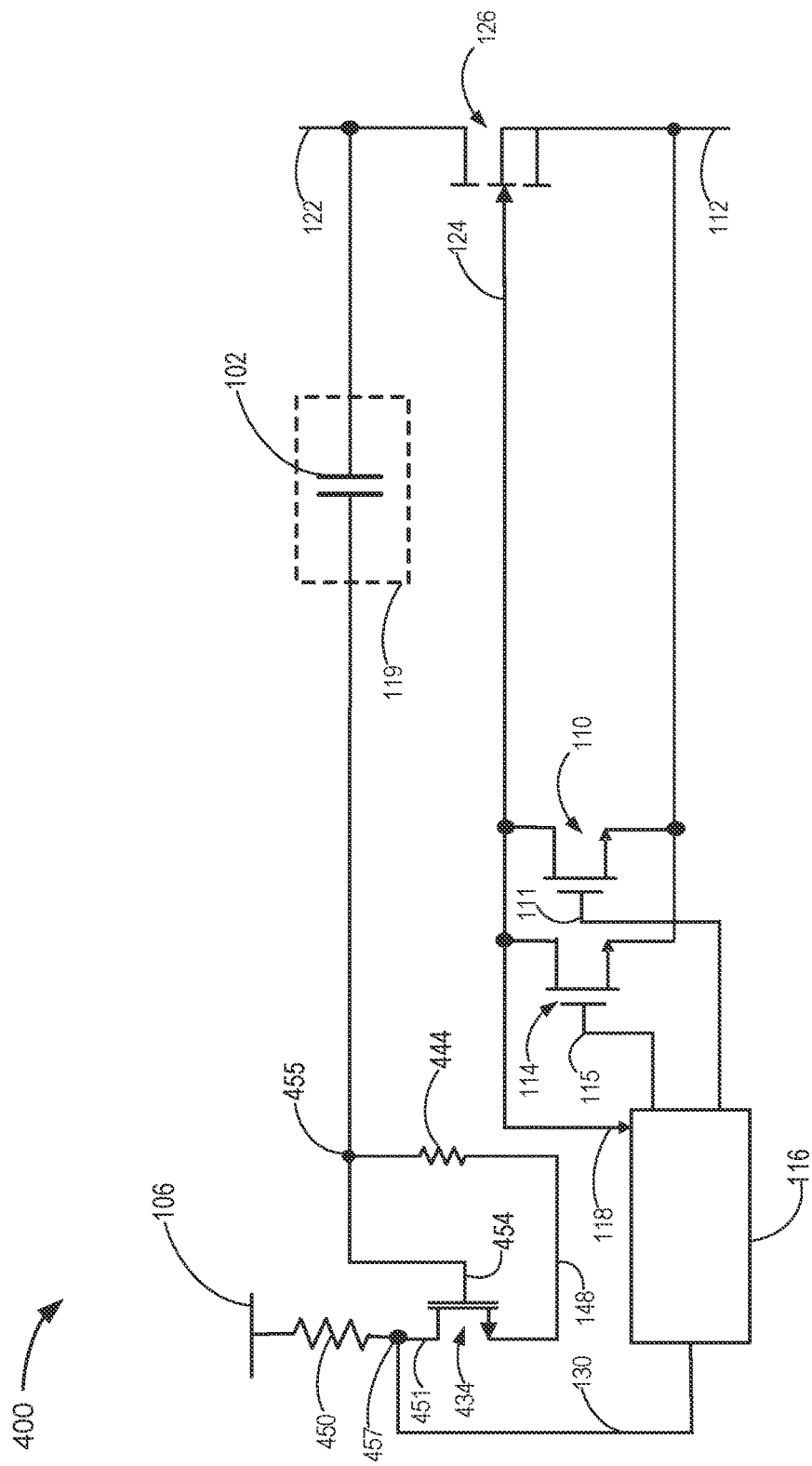
FIG. 4 illustrates a turn-off dV/dt control circuit according to an embodiment of the disclosure.

FIG. 4 illustrates a turn-off control circuit 400 according to an embodiment of the disclosure. Circuit 400 is similar to circuit 100 shown in FIG. 1, except the current mirror circuit 140 of circuit 100 has been replaced by a resistor 444 and a transistor 434. As shown in FIG. 4, when the sensing capacitor 102, which can be connected to the drain terminal 122 of the GaN power transistor 126, detects a dV/dt event at drain terminal 122, it generates a current I=C×dV/dt. This current can be fed into resistor 444 where it develops a voltage across resistor 444 causing a voltage at node 455 to rise. Node 455 is connected to gate 454 of transistor 434. The rise of the voltage at the gate 454 of transistor 434 can cause the transistor 434 to turn on. Since drain 451 of transistor 434 is connected to a resistor 450, a current flow through resistor 450 causes node 457 to go low.

Node 457 can be connected to logic circuit 116, which can control the first and second pull-down transistors 114 and 110, respectively. When node 457 goes low indicating a dV/dt event has occurred, logic circuit 116 can turn off transistor 110 (fast pull-down transistor) while leaving transistor 114 (slow pull-down transistor) in the on state. Transistors 114 and 110 can be used to pull down the gate terminal 124 of the GaN power transistor 126. When transistors 114 and 110 are turned on, the gate terminal 124 of the GaN power transistor 126 can go low. A size of transistor 110 can be 5 to 10 times larger than transistor 114, therefore transistor 110 can pull down the gate terminal 124 at a faster rate than transistor 114 can. As appreciated by one of ordinary skill in the art having the benefit of this disclosure, the value for the ratio of transistor size can be set to any suitable value as appropriate for specific applications.

Figure 5:
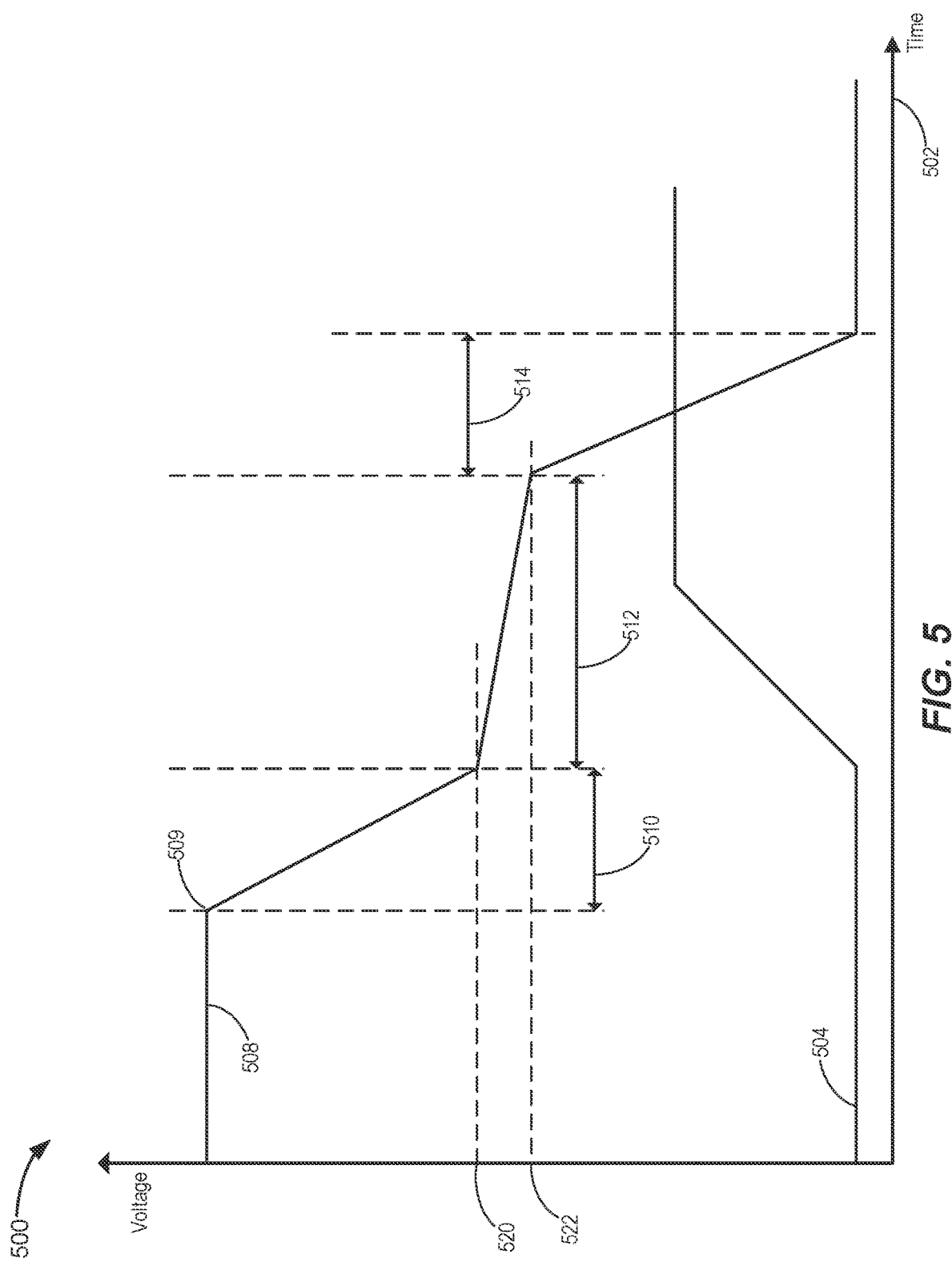
FIG. 5 illustrates a timing diagram showing gate and drain voltages as a function of time for power transistor in the turn-off control circuit of FIG. 4.

Initially both transistors 114 and 110 are turned on in order to turn off the GaN power transistor 126. Sensing circuit 119 can indicate that a voltage at the gate terminal 124 has reached the miller plateau by detecting a rise in the voltage at drain terminal 122. This is illustrated further in timing diagram 500 of FIG. 5. Timing diagram 500 shows the gate and drain voltages of the GaN power transistor 126 as a function of time 502. Graph 508 shows the voltage at the gate of the GaN power transistor 126 and graph 504 shows the voltage at the drain of the GaN power transistor. Initially the gate voltage starts at in a high state. When both transistors 110 and 114 are turned on, the gate voltage of the GaN power transistor 126 drops at a relatively fast rate as shown in region 510. In region 512, the gate voltage reaches the miller plateau.

During a time period in region 510, the gate voltage may drop at a relatively rapid rate from an on-state voltage 509 to a first intermediate voltage 520. This rapid drop minimizes delay time. During region 512, the gate voltage drops from the first intermediate voltage 520 to a second intermediate voltage 522 at a slower rate. This slow down can result in a significant reduction in EMI by keeping the gate voltage between the first and the second intermediate voltages. The slow-down of the rate of drop of the gate voltage in the second section slows down the discharge of the gate, which reduces ripple in the drain-to-source current of the GaN power transistor 126. In region 512, the sensing circuit 119 detects the drain dV/dt and causes the logic circuit 116 to turn off transistor 110 while keeping on transistor 114. When the dV/dt event ends, the gate voltage of the GaN power transistor starts to drop again as indicated in region 514. Following region 514, the logic circuit 116 can detect that the gate voltage has dropped below a threshold, causing transistor 110 to turn on again. In this way, the rate of drop in the gate voltage of GaN power transistor can be slowed down. Further, logic circuit 116 can sense the gate voltage of the GaN power transistor at node 118. When logic circuit 116 detects that the gate voltage of the GaN power transistor 126 has dropped below a threshold value, the logic circuit can turn on transistor 110. By having both transistors 114 and 110 in an on state providing a pull down on the gate of the GaN power transistor, circuit 400 can maintain the GaN power transistor 126 in an off state, even if there is a subsequent dV/dt event. This dV/dt immunity of the circuit can be improved by having both transistors 114 and 110 in an on state when the GaN power transistor is off.

Figure 6:
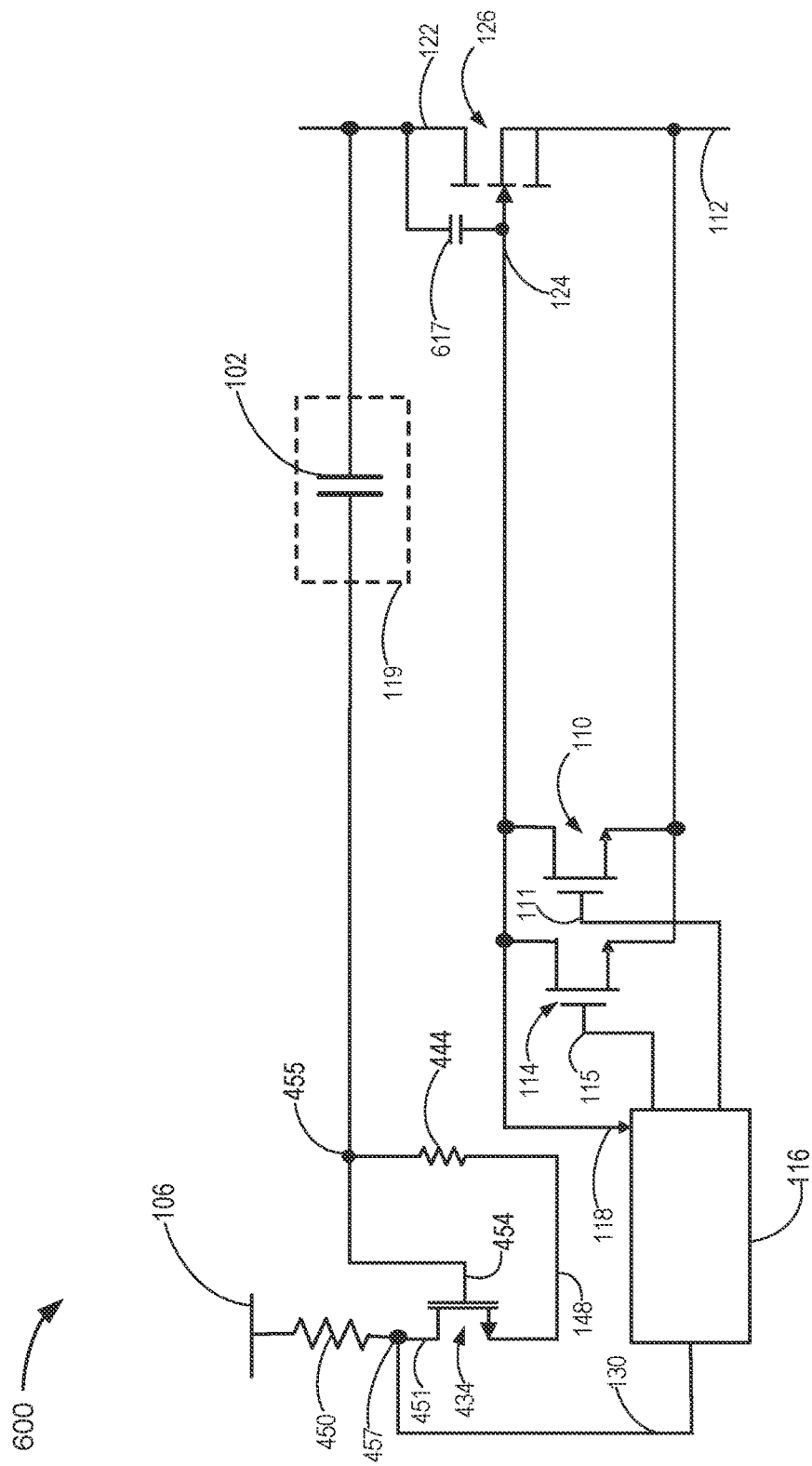
FIG. 6 illustrates a turn-off dV/dt control circuit according to an embodiment of the disclosure.

FIG. 6 illustrates a turn-off control circuit 600 according to an embodiment of the disclosure. Circuit 600 is similar to circuit 400 with an addition of capacitor 617 that can be connected between gate terminal 124 and drain terminal 122 of the GaN power transistor 126. Capacitor 617 can provide additional reduction in the dV/dt transition rate. During the miller plateau (i.e., region 512), the turn-off dV/dt of the GaN power transistor 126 is defined by a current Isink being sunk by the slow pull-down transistor 114 and a magnitude of gate to drain capacitance Cgd. Specifically, turn-off dV/dt=Isink/Cgd. By adding extra capacitor 617 to the Cgd, embodiments of the present disclosure can slow down the turn-off dV/dt. It will be understood by those skilled in the art that capacitor 617 can be formed from various suitable materials and layers, for example, but not limited to, capacitor 617 can be a transistor capacitor or metal-dielectric-metal capacitor.

Figure 7:
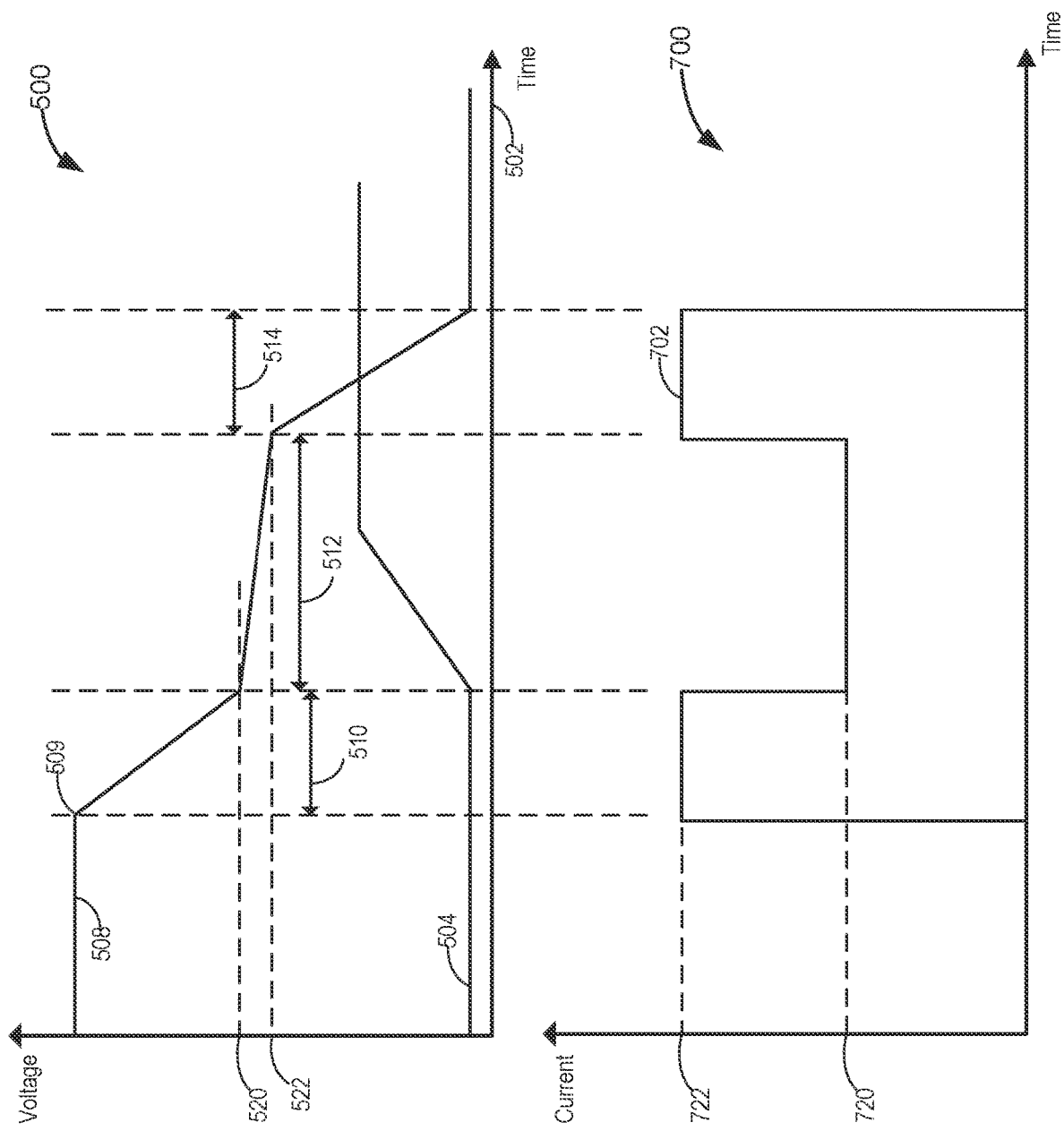
FIG. 7 illustrates a timing diagram showing gate to source current flow for the power transistor in the turn-off control circuit of FIG. 1.

FIG. 7 illustrates a timing diagram 700 showing current flow at the gate terminal 124. Timing diagram 500 is also replicated to illustrate a comparison of the voltage at the gate terminal 124 to the current flow at the gate terminal 124. The current flow depicted in graph 702 is the current flowing from the gate terminal 124 to the source terminal 112. During region 510, both of the first and second pull-down transistors 114 and 110, respectively, are turned on, causing a relatively large current to flow from the gate terminal 124. This causes a relatively rapid voltage drop from an on-state voltage 509 to a first intermediate voltage 520. During region 512, the second pull-down transistor may be turned off, thus the current flow at the gate terminal 124 reduces from a relatively large value of 722 to a relatively small value of 720. In this way, in region 512, the gate voltage at the gate terminal 124 drops at a relatively slow rate with respect to time. During region 514, the second pull-down transistor may be turned on again, thus the current flow at the gate terminal 124 increases from a relatively small value of 720 to a relatively large value of 722. In this way, in region 514, the gate voltage at the gate terminal 124 drops at a relatively fast rate with respect to time.

Figure 8:
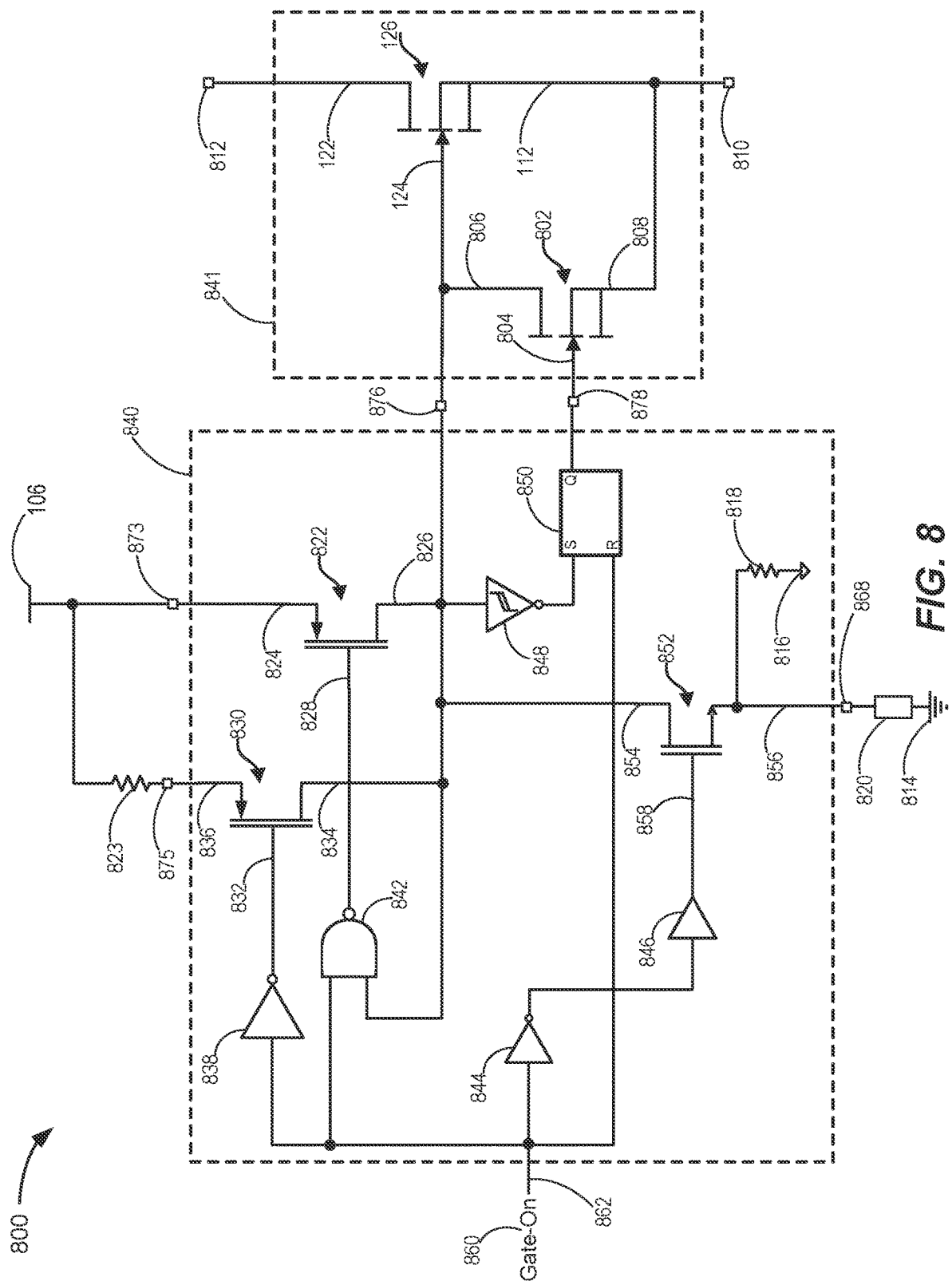
FIG. 8 illustrates a dV/dt control circuit with an impedance element according to an embodiment of the disclosure.

FIG. 8 illustrates a dV/dt control circuit 800 according to an embodiment of the disclosure. As shown in FIG. 8, circuit 800 can include a logic and control circuit 840 coupled to a power switch circuit 841. Power switch circuit 841 can include a GaN power transistor 126, with a drain terminal 122, a gate terminal 124 and a source terminal 112. Drain terminal 122 may be connected to a pin 812 and source terminal 112 may be connected to a pin 810. GaN power transistor 126 can be used in a low-side configuration, where pin 810 may be connected to a ground node, or in a high-side configuration where pin 810 may be connected to a switch node (Vsw). In some embodiments, power switch circuit 841 Circuit can further include a pull-down transistor 802 with a drain terminal 806, a gate terminal 804 and a source terminal 808. Drain terminal 806 may be connected to the gate terminal 124 terminal and source terminal 808 may be connected to the source terminal 112. Gate terminal 124 and drain terminal 806 may both be coupled to a pin 876. Gate terminal 804 may be coupled to a pin 878. In some embodiments, GaN power transistor 126 and pull-down transistor 802 may be integrated in the same GaN-based die, while the logic and control circuit 840 can be integrated on a separate silicon-based die. In some embodiments, logic and control circuit 840 and power switch circuit 841 may be formed on the same die. In various embodiments, GaN power transistor 126 and pull-down transistor 802 may be formed on separate die.

Circuit 800 can allow for a control of a dV/dt at the drain terminal 122. Logic and control circuit 840 can include a transistor 822 having a source terminal 824, a gate terminal 828 and a drain terminal 826. Source terminal 824 can be coupled to a pin 873. Logic and control circuit 840 can include a transistor 830 having a source terminal 836, a gate terminal 832 and a drain terminal 834. Source terminal 836 may be coupled to a pin 875. Logic and control circuit 840 can further include an inverter 838 coupled to gate terminal 832, and a NAND gate 842 coupled to the gate terminal 828. Logic and control circuit 840 can further include a comparator 848. In some embodiments, comparator 848 may have hysteresis. In some embodiments, a Schmitt trigger may be used instead of the comparator 848. Logic and control circuit 840 can further include a latch 850. In some embodiments, latch 850 can be a Set/RESET latch. An input terminal of the comparator 848 may be coupled to the drain terminal 826, while an output terminal of the comparator 848 may be coupled to the latch 850. An input terminal of the comparator 848 may be coupled to the gate terminal 124.

Logic and control circuit 840 can further include an input terminal 862 that is arranged to receive a signal 860. In some embodiments, signal 860 may be a Gate-On signal that is arranged to turn on the GaN power transistor 126. Logic and control circuit 840 can further include an inverter 844 and a buffer 846. An input terminal of the inverter 844 can be coupled to the input terminal 862 and an output terminal of the inverter 844 can be coupled to an input terminal of buffer 846. Logic and control circuit 840 can further include a transistor 852 having a drain terminal 854, a gate terminal 858 and a source terminal 856. The gate terminal 858 can be coupled to an output terminal of the buffer 846. The drain terminal 854 can be coupled to gate terminal 124. The drain terminal 826 can coupled to the gate terminal 124. The drain terminal 834 can be coupled to the gate terminal 124. The source terminal 856 can be coupled to a resistive element 818. Resistive element may be connected to an on-chip ground node 816. In some embodiments, ground node 816 may be coupled to the ground node 814. The source terminal 856 can be coupled to a pin 868.

In some embodiments, the components of the logic and control circuit 840 can be monolithically integrated on an IC chip. In various embodiments, the logic and control circuit 840 may be monolithically integrated with the GaN power transistor 126 and the pull-down transistor 802. In some embodiments, logic and control circuit 840 may be formed on semiconductor die, for example, but not limited to, silicon. In various embodiments, logic and control circuit 840 formed in a silicon IC may be an external chip that is coupled to GaN power transistor 126 and the pull-down transistor through connection elements, such as, but not limited to, bond wires. In some embodiments, logic and control circuit 840 can be formed in a silicon IC that is coupled to an external impedance element 820. In various embodiments, impedance element 820 can include one or more passive components. In some embodiments, impedance element 820 can be a resistive element, while in other embodiments impedance element 820 can include a resistive element and a capacitive element, where the capacitive element is coupled in parallel to the resistive element. In various embodiments, the impedance element may include a network of resistive and capacitive elements. Impedance element 820 can be coupled to the pin 868 and to ground. In some embodiments, circuit 800 may be used in a high-side configuration, where impedance element 820 be connected to a switch nod (Vsw). Logic and control circuit 840 may be coupled to the $V_{dd}$ terminal 106 through a resistive element 823. Pin 873 may be connected to the $V_{dd}$ terminal 106. In some embodiments where circuit 800 is used in a high-side configuration, $V_{dd}$ terminal 106 may be a floating power supply.

The operation of circuit 800 is now further described. When the signal 860 is in a high state, the transistor 830 may be turned-on allowing a first current to flow from $V_{dd}$ terminal 106 through the resistive element 823 to the gate terminal 124. Further, transistor 822 may be turned-on during this period such that a second current can flow from the $V_{dd}$ terminal 106 to the gate terminal 124. In this way, GaN power transistor can be turned-on in a relatively fast rate. In some embodiments, transistor 822 may be turned-off during a turning-on of the GaN power transistor 126 in order to slow down the rise of the voltage at the gate terminal 124. In various embodiments, after a slow-down of the rise of the voltage at the gate terminal, both transistors 830 and 822 may be turned-on again, thereby providing for a relatively fast rise of the voltage at the gate terminal 124. In this way, the voltage at the gate terminal 124 may rise at a relatively fast, slow and then fast rate.

During a turn-off of the GaN power transistor 126, embodiments of the disclosure allow for a controlled reduction of the voltage at the gate terminal 124. In some embodiments, where the logic and control circuit 840 is a stand-alone chip that is connected to the GaN power transistor 126 through bond wires, it can be beneficial to control a rate of reduction of the voltage at the gate terminal 124, because existence of parasitic inductances in the bond wires may cause excessive ringing and oscillations on the voltage at the gate terminal. These excessive rings and oscillations may cause the GaN power transistor 126 to turn back on when it is to be in an off state. When signal 860 goes low, it can turn on the transistor 852 thereby allowing a discharge current to flow from the gate terminal 124 through the external impedance element 820 to the ground node 814. A value of the impedance element 820 can determine a value of the discharge current, thus a rate of reduction of the gate voltage at the gate terminal 124 can be controlled. Therefore, by providing an external impedance element 820, a user can control a rate of reduction of the gate voltage at the gate terminal 124. For example, for an impedance element that includes a resistor, a relatively large value of the resistor may reduce the drain terminal 122 dV/dt, and a relatively small value of the resistor may increase the drain terminal 122 dV/dt. Therefore, this technique is user programmable. In some embodiments, a resistive element 818 can be coupled to the source terminal 856 such that if a user cannot connect an impedance element 820 to the pin 868, there still can exist a path for the discharge current to flow and turn off the voltage at the gate terminal 124.

A presence of parasitic inductances may cause excessive ringing and oscillations of the voltage at the gate terminal 124 during turn-off of the GaN power transistor 126. A detection circuit that includes the comparator 848 and the latch 850, and the pull-down transistor 802 can be arranged to prevent these excessive ringing and oscillations. Comparator 848 can monitor the voltage at the gate terminal 124 and compare it to a threshold voltage. When the voltage at the gate terminal 124 drops to a value below the threshold voltage, comparator 848 can act and turn on the latch 850, thereby turning on the pull-down transistor 802. Upon the turn-on of pull-down transistor 802, it can pull down the voltage at the gate terminal 124, thereby keeping the GaN power transistor 126 in an off state. The pull-down transistor 802 may be formed on the same GaN-based die as the GaN power transistor 126, thus parasitic inductances can be minimized between the pull-down transistor 802 and the GaN power transistor 126. In this way, ringing and oscillations can be minimized at the terminals of GaN power transistor 126. In some embodiments a value of the threshold voltage may be, for example, 0.6 V, while in other embodiments a value of the threshold voltage can be, for example, 0.3 to 0.9 V. The above described technique can mitigate effects of parasitic inductances and can enable use of an external impedance element to control the dV/dt.

Figure 9:
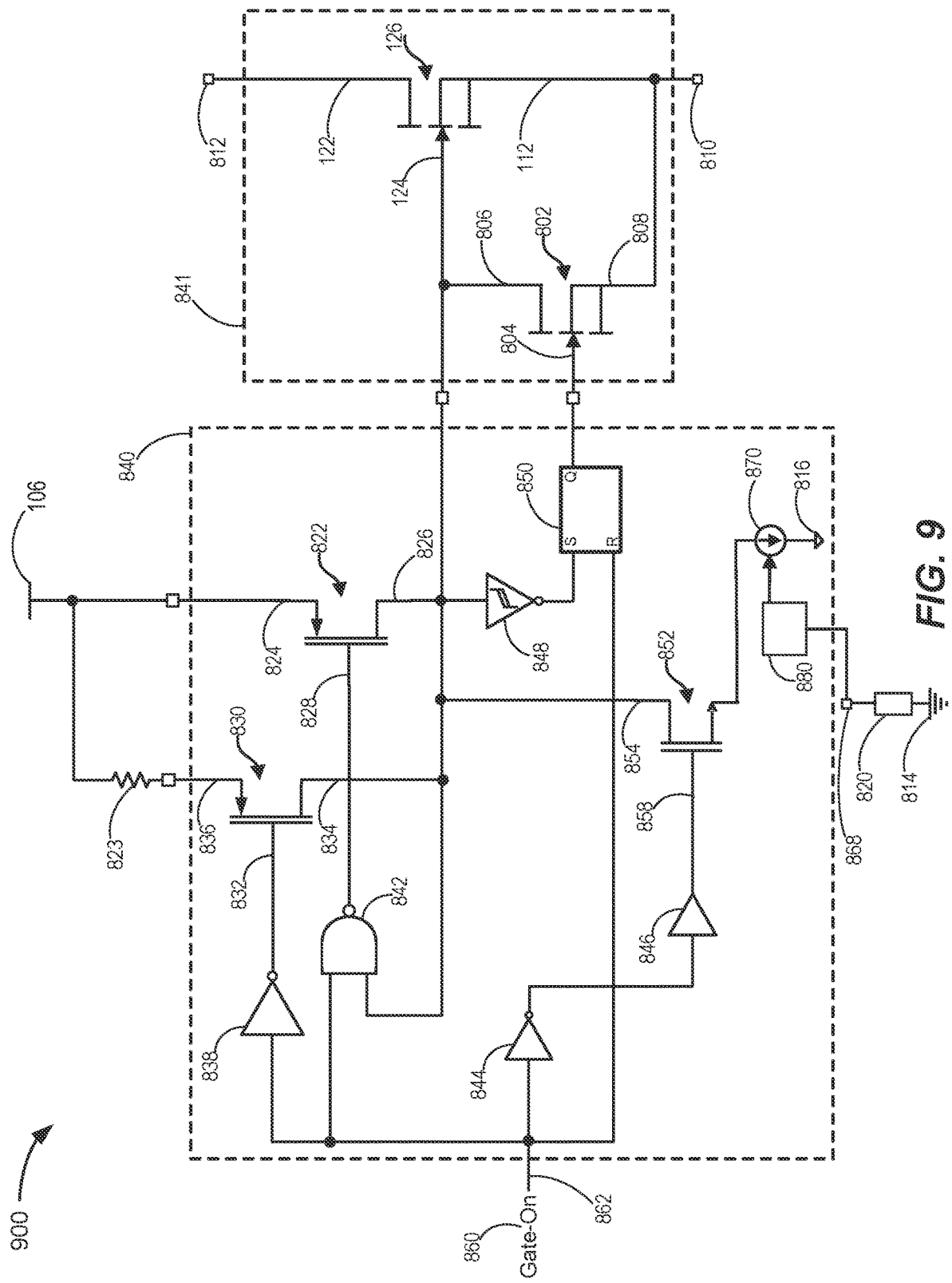
FIG. 9 illustrates a dV/dt control circuit with an impedance element monitor and current sink, according to an embodiment of the disclosure.

In some embodiments, circuit 800 can sense a value of the impedance element 820 and sink the discharge current of the gate terminal 124 through a current sink 870. FIG. 9 illustrates a schematic of a circuit 900 that can control dV/dt according to an embodiment of the disclosure. Circuit 900 is similar to circuit 800, but the resistive element 818 has been replace by the current sink 870. Circuit 900 can further include a circuit 880 that can sense a value of the impedance element 820 and set a value of a current through the current sink 870. In this way, the gate terminal 124 discharge current can flow through the current sink 870. Therefore, a rate of reduction of the voltage at the gate terminal 124 can be controlled, thereby controlling dV/dt at the gate terminal 124 and drain terminal 122. A user can change a value of the impedance element 820, thereby setting a value for the discharge current through the current sink and customizing a turn-off dV/dt control for a specific application.

Figure 10:
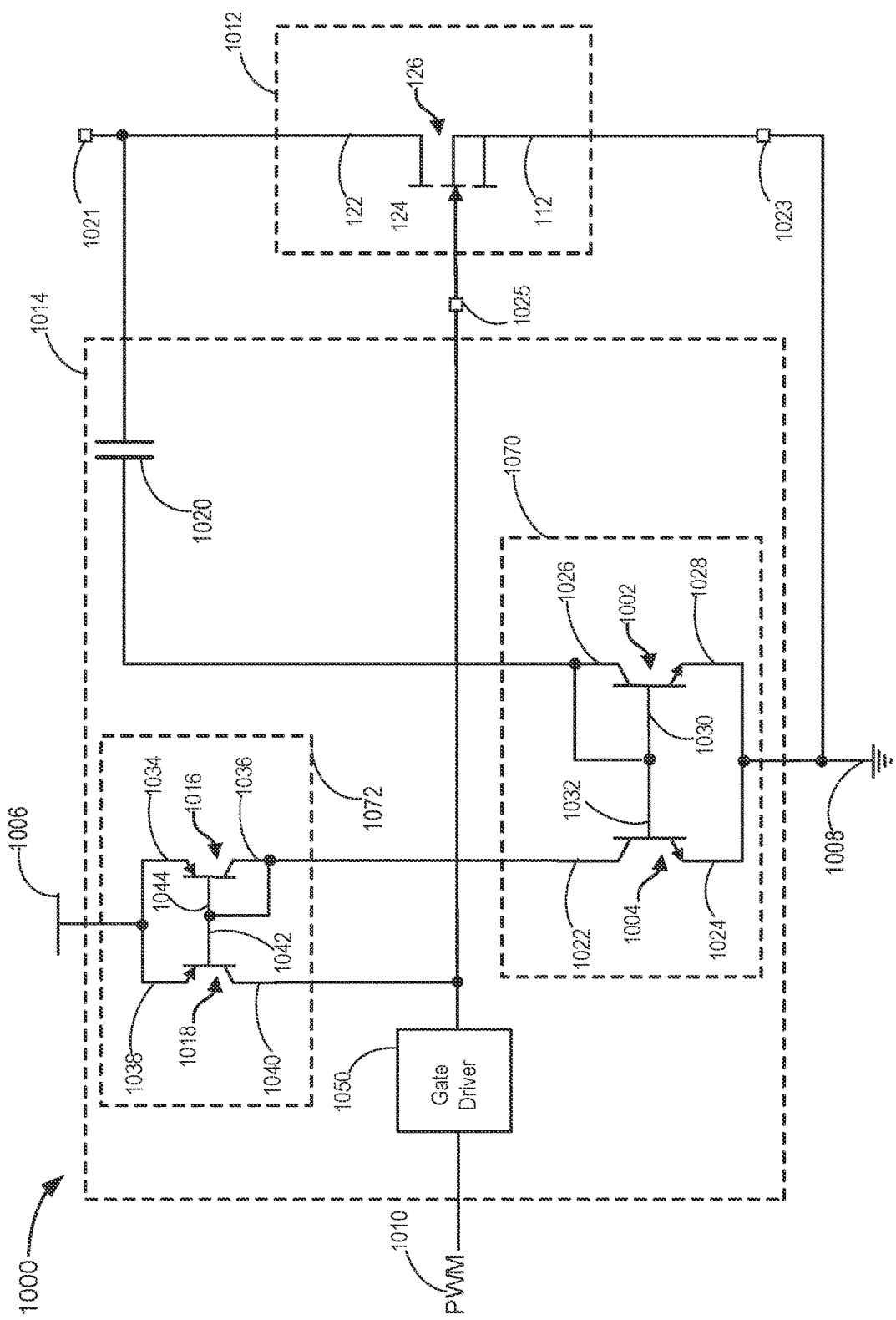
FIG. 10 illustrates a dV/dt control circuit employing multiple current mirrors according to an embodiment of the disclosure.

FIG. 10 illustrates a dV/dt control circuit 1000 according to an embodiment of the disclosure. Circuit 1000 can include a GaN-based die 1012 and a silicon-based die 1014 that includes silicon-based circuits. In some embodiments, the silicon-based circuits can be monolithically integrated into the GaN-based die 1012 to form a unitary die. In various embodiments, some components of the silicon-based circuits may be monolithically integrated into the GaN-based die 1012, while the other components are formed on the silicon-based die 1014. Circuit 1000 can include a GaN power transistor 126 having a drain terminal 122, a gate terminal 124 and a source terminal 112. Drain terminal 122 can be coupled to a pin 1021, source terminal 112 can be coupled to a pin 1023, and the gate terminal 124 can be coupled to a pin 1025. GaN power transistor 126 can be used in a low-side configuration, where pin 1023 may be connected to a ground node 1008, or in a high-side configuration where pin 1023 may be connected to a switch node (Vsw).

Circuit 1000 can further include a sensing element 1020 coupled to the drain terminal 122. In some embodiments, the sensing element can be a capacitor. In various embodiments, the sensing element may be a network of passive elements that includes a capacitor and a resistor. Circuit 1000 can further include a first current mirror 1070 and a second current mirror 1072. The sensing element 1020 may be coupled to the first current mirror 1070. The first current mirror 1070 can be coupled to the ground node 1008 and to the second current mirror 1072. The first current mirror 1070 can include a transistor 1002 having a collector terminal 1026, a base terminal 1030 and an emitter terminal 1028. The first current mirror 1070 can further include a transistor 1004 having a collector terminal 1022, a base terminal 1032 and an emitter terminal 1024. In some embodiments, transistors 1002 and 1004 can be MOS transistors. In various embodiments, transistors 1002 and 1004 may be GaN-based transistors. Collector terminal 1026 can be coupled to the base terminal 1030, and the base terminal 1030 can be coupled to the base terminal 1032. The second current mirror 1072 can include a transistor 1016 having a collector terminal 1036, a source terminal 1034 and a base terminal 1044. The collector terminal 1036 can be coupled to the collector terminal 1022 and to the base terminal 1044. The second current mirror 1072 can further include a transistor 1018 having a source terminal 1038, a base terminal 1042 and a collector terminal 1040. The base terminal 1044 can be coupled to the base terminal 1042. In some embodiments, transistors 1016 and 1018 can be MOS transistors. In various embodiments, transistors 1016 and 1018 may be GaN-based transistors. The second current mirror 1072 can be coupled to the power terminal 1006.

Circuit 1000 can further include a gate driver circuit 1050 coupled to the gate terminal 124. The gate driver circuit can be configured to receive an input signal 1010 and control a voltage at the gate terminal 124 in response to receiving the input signal. In some embodiments, the input signal can be a pulse width modulated (PWM) signal. Collector terminal 1040 can coupled to the gate terminal 124.

The operation of circuit 1000 is now described. When the PWM signal is high, the voltage at the gate terminal 124 is high state, therefore the GaN power transistor 126 is in a conductive state, and a current may flow from the drain terminal 122 to the source terminal, or vice-versa. When the PWM signal transitions to low, the voltage at the gate terminal 124 transitions to a low state and the GaN power transistor 126 transitions to a low state. The current flowing from the drain terminal 122 to the source terminal 112 starts to discharge, however due to the existence of parasitic elements in connecting elements, such as parasitic inductances, a dV/dt event may occur at the drain terminal 122, i.e., a voltage spike may be generated at the drain terminal 122. This voltage spike may couple onto the gate terminal 124 through a parasitic capacitance between the drain terminal 122 and the gate terminal 124, and may cause the voltage at the gate terminal 124 to rise, causing the GaN power transistor 126 to turn back on. This is not desirable. Embodiments of the present disclosure can prevent a turn-off dV/dt event from turning on a voltage at the gate terminal 124.

When a dV/dt event occurs at the drain terminal 122, the sensing element 1020 can sense the voltage change and generate a first current that can flow from the collector terminal 1026. The first current is mirrored by the first current mirror 1070 and a second current can be generated that flows into the collector terminal 1022. In some embodiments, a magnitude of the first current may be substantially equal to the second current. The second current can be fed into the second current mirror 1072 and a third current can be generated that flows into the collector terminal 1040. The third current can discharge a gate charge at the gate terminal 124, thereby lowering a voltage at the gate terminal 124. Thus, the voltage at the gate terminal 124 can be prevented from rising and causing an undesired turn-on. It will be understood by one of skill in the art having the benefit of this disclosure that the size of the transistors used can be determined based on a specific application. Further, the type of transistors used can be determined based on a specific application. Moreover, the above describes a positive dV/dt event. Embodiments of the disclosure also can operate during a negative dV/dt, where the third current may flow into the gate terminal 124, thereby preventing a voltage at the gate terminal to go negative.

Although transistor dV/dt control circuits are described and illustrated herein with respect to one particular configuration of GaN power transistor, embodiments of the disclosure are suitable for use with other configurations of GaN-based and non-GaN-based power converter circuits, such as power converters using silicon, silicon-carbide or other semiconductor devices. For example, EMI performance of any power converter using semiconductor transistors can be improved by utilizing embodiments of the disclosure.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A circuit comprising:
   a first switch having a first gate terminal, a first source terminal and a first drain terminal;
   a sense circuit coupled to the first drain terminal and arranged to generate a signal in response to sensing a voltage at the first drain terminal; and
   a control circuit coupled to the first gate terminal and arranged to change a voltage at the first gate terminal in response to receiving the signal, wherein the voltage at the first gate terminal is changed at a first rate of voltage with respect to time from a first voltage to a first intermediate voltage, and at a second rate of voltage with respect to time from the first intermediate voltage to a second intermediate voltage,
   wherein the second intermediate voltage is lower than the first intermediate voltage; and
   wherein the voltage at the first gate terminal is further changed from the second intermediate voltage to an off-state voltage at a third rate of voltage with respect to time, and wherein the first rate of voltage with respect to time is higher than the second rate of voltage with respect to time.

2. The circuit of claim 1, further comprising a current mirror circuit coupled to the sense circuit.

3. The circuit of claim 2, wherein the control circuit is coupled to the current mirror circuit.

4. The circuit of claim 1, wherein the first rate of voltage with respect to time is higher than the second rate of voltage with respect to time.

5. The circuit of claim 1, wherein the third rate of voltage with respect to time is higher than the second rate of voltage with respect to time.

6. The circuit of claim 1, wherein the control circuit comprises a second switch having a second gate terminal, a second drain terminal and a second source terminal, and wherein the second drain terminal is coupled to the first gate terminal.

7. The circuit of claim 6, wherein the control circuit is arranged to cause the second switch to discharge the first gate terminal such that the voltage at the first gate terminal is changed at the first rate of voltage with respect to time from the first voltage to the first intermediate voltage, and at the second rate of voltage with respect to time from the first intermediate voltage to the second intermediate voltage.

8. The circuit of claim 6, wherein the control circuit further comprises a third switch having a third gate terminal, a third drain terminal and a third source terminal, and wherein the third drain terminal is coupled to the first gate terminal.

9. The circuit of claim 8, wherein the third switch is a pull-down switch.

10. A circuit comprising:
    a first switch having a first gate terminal, a first source terminal and a first drain terminal;

a sense circuit coupled to the first drain terminal and arranged to generate a signal in response to sensing a voltage at the first drain terminal; and a control circuit coupled to the first gate terminal and arranged, in response to receiving the signal, to allow a discharge current to flow from the first gate terminal at a first current rate during a first time period, and to allow the discharge current to flow from the first gate terminal at a second current rate during a second time period; and a current mirror circuit coupled to the sense circuit.

11. The circuit of claim 10, wherein the control circuit is further arranged to allow the discharge current to flow from the first gate terminal at a third current rate during a third time period.

12. The circuit of claim 10, wherein the first current rate is higher than the second current rate.

13. The circuit of claim 11, wherein the third current rate is higher than the second current rate.

14. The circuit of claim 10, wherein the control circuit is further arranged to allow the discharge current to flow from the first gate terminal at the first current rate during a third time period.

15. The circuit of claim 14, wherein the control circuit comprises a second switch having a second gate terminal, a second drain terminal and a second source terminal, wherein the second drain terminal is coupled to the first gate terminal and wherein the second switch is arranged to allow the discharge current to flow at the first current rate.

16. The circuit of claim 15, wherein the control circuit further comprises a third switch having a third gate terminal, a third drain terminal and a third source terminal, and wherein the third drain terminal is coupled to the first gate terminal, wherein the second and third switches are arranged, in combination, to allow the discharge current to flow at the first current rate and at the second current rate.

17. The circuit of claim 10, wherein the control circuit is coupled to the current mirror circuit.

18. A method operating a circuit, the method comprising:

providing a first switch having a first gate terminal, a first source terminal and a first drain terminal;

providing a sense circuit coupled to the first drain terminal;

providing a current mirror circuit coupled to the sense circuit;

detecting, by the sense circuit, a voltage at the first drain terminal;

generating, by the sense circuit, a signal corresponding to the detected voltage at the first drain terminal;

receiving, by a control circuit coupled to the first gate terminal, the signal;

in response to receiving the signal, allowing a discharge current to flow from the first gate terminal at a first current rate during a first time period, allowing the discharge current to flow from the first gate terminal at a second current rate during a second time period, and allowing the discharge current to flow from the first gate terminal at a third current rate during a third time period; and wherein the first current rate is higher than the second current rate and the first current rate is equal to the third current rate.

* * * * *